United States Patent
Cheng et al.

(10) Patent No.: US 7,145,162 B2
(45) Date of Patent: Dec. 5, 2006

(54) WIRE LOOP HEIGHT MEASUREMENT APPARATUS AND METHOD

(75) Inventors: Xiao Hui Cheng, Singapore (SG); Wing Hong Leung, Hong Kong (HK)

(73) Assignee: ASM Assembly Automation Ltd., Hong Kong (HK)

( * ) Notice: Subject to any disclaimer, the term of this patent is extended or adjusted under 35 U.S.C. 154(b) by 306 days.

(21) Appl. No.: 10/698,767

(22) Filed: Oct. 31, 2003

(65) Prior Publication Data
US 2005/0094865 A1   May 5, 2005

(51) Int. Cl.
 *G01N 21/86* (2006.01)
 *H04N 7/18* (2006.01)
(52) U.S. Cl. .................. 250/559.34; 348/125; 348/126
(58) Field of Classification Search .......... 250/559.34, 250/559.4, 559.38; 356/237.4, 237.5; 348/125, 348/126
See application file for complete search history.

(56) References Cited

U.S. PATENT DOCUMENTS

| | | | | |
|---|---|---|---|---|
| 4,942,618 A | * | 7/1990 | Sumi et al. | 382/154 |
| 5,347,362 A | * | 9/1994 | Sugawara | 356/625 |
| 5,576,828 A | * | 11/1996 | Tomiyama et al. | 356/625 |
| 5,621,218 A | * | 4/1997 | Tanaka | 250/559.34 |
| 6,750,974 B1 | * | 6/2004 | Svetkoff et al. | 356/602 |

FOREIGN PATENT DOCUMENTS

TW   365037   7/1999

* cited by examiner

*Primary Examiner*—Georgia Epps
*Assistant Examiner*—Don Williams
(74) *Attorney, Agent, or Firm*—Ostrolenk, Faber, Gerb & Soffen, LLP

(57) ABSTRACT

The invention provides a method and an apparatus for determining a height of a point on a wire loop. A height gauge device is positioned over the point on the wire loop to be measured. Incident light is projected from the height gauge device for illuminating the point. The height gauge device receives reflected light produced from the incident light and a processor coupled to the height gauge device determines from a characteristic of the reflected light the height of the said point relative to a reference surface. Further methods and apparatus for finding a position and height of a highest point on the wire loop are also provided.

20 Claims, 5 Drawing Sheets

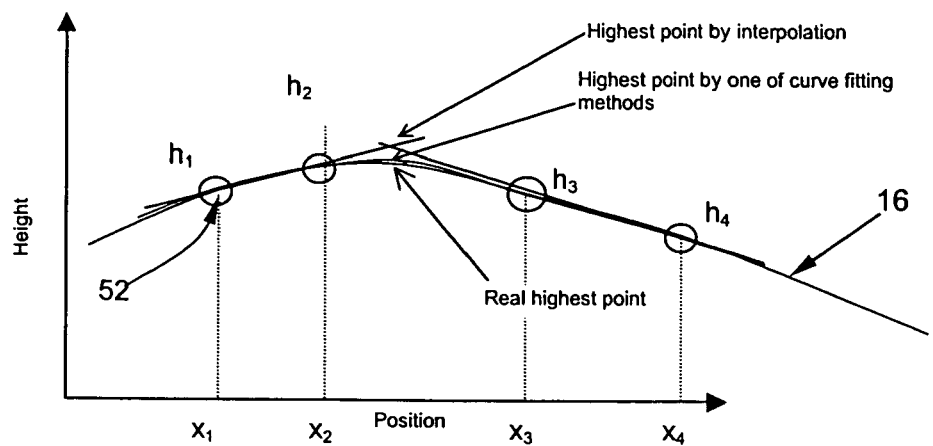
FIGURE 7
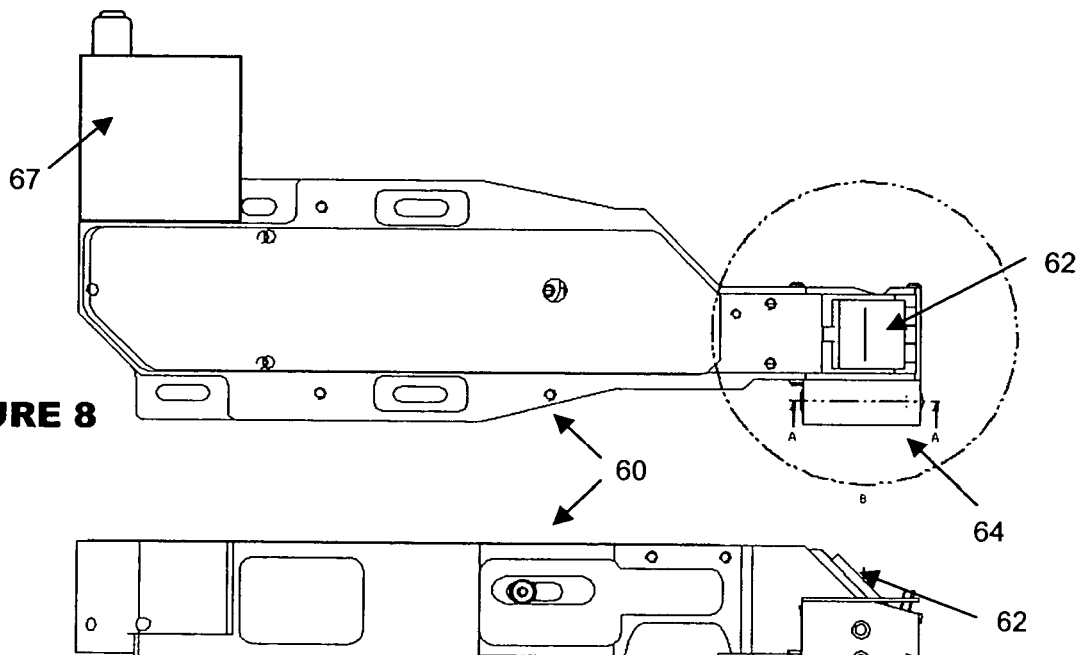
FIGURE 8
FIGURE 9
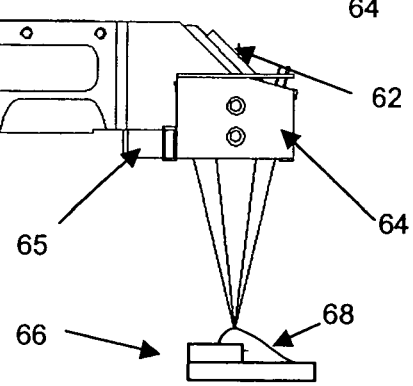

WIRE LOOP HEIGHT MEASUREMENT APPARATUS AND METHOD

FIELD OF THE INVENTION

The invention relates to an apparatus and method for determining heights of various points along wire loops formed in a semiconductor manufacturing process, such as in a wire bonding process. The invention is especially useful for, but not limited to, determining the highest points of wire loops comprising bonding wires.

BACKGROUND AND PRIOR ART

Wire bonding is used in the microelectronics industry as a means of making electrical interconnections between semiconductor chips and substrates (such as leadframe carriers and printed circuit or wire boards). Wires made from gold, aluminum and copper are commonly used. The interconnect process is automated and it is important to develop processes that are of low cost and high yield, with sufficient long-term reliability to satisfy an end-user.

With improvements in back-end semiconductor technology and techniques, bonding wire diameter and bond pitch are becoming smaller and packaging density is on the increase. As a result, greater accuracy and stability is required to form well-controlled wire loops. These wire loops need to be inspected to ensure that they are properly formed within certain pre-defined parameters. By practicing height measurement, stability and reliability of a bonding machine may be maintained. To conduct inspection and measurement, optical methods are usually preferred because they are non-destructive and non-intrusive.

There are various methods used in the prior art to measure a height of a wire loop. One example is U.S. Pat. No. 4,942,618 for "Method and Apparatus for Determining the Shape of Wire or Like Article". This method employs a plurality of coaxial CCD cameras having their focal planes positioned differently from each other to view a wire loop. The wire loop is viewed by the CCD cameras and the wire images collected by the plurality of cameras are processed to determine the contrast and size of the images, and the results are used to determine the profile of the wire. However, such an apparatus is bulky and cumbersome to control. Further, more cameras have to be used to improve measurement resolution and accuracy.

Another example is U.S. Pat. No. 5,576,828 for "Bonding Wire Detection Method". In this disclosure, the height of a wire bonded between a semiconductor chip and a lead frame is determined using illumination from circularly arranged LED's installed in a low-angle illuminating device. The angle of illumination is set within a certain range and a focal depth of an optical device is set to be shallow. A dark area appears in the central portion of the wire at the focal point of the optical system. The optical device is moved up and down to obtain a focused image of the dark area, so as to determine the height of the wire relative to a height of the optical system. A problem with this apparatus is that the imaging system is bulky. As a result, the need to lift and lower the relatively large mass of the optical system results in reduced speed of motion on the whole.

A further example of the use of an optical system to measure a height of a wire loop is disclosed in U.S. Pat. No. 5,583,641. A correlation between a wire height and wire width is investigated by shifting the focusing level of an optical system. A detection level is set based upon an upper limit level and a lower limit level. These levels are to be the reference levels corresponding to an acceptable height of the wire to be detected. The imaged width of the wire is compared to the upper and lower limit levels to determine whether the height of the wire is within an acceptable range. A problem with this system is again that the optical system or a part of it has to be moved up and down to measure different points on the wire, and the motion of such a relatively large mass slows down the apparatus. The imaging system is also bulky, and the optics design is relatively complex.

SUMMARY OF THE INVENTION

Therefore, it is an object of the invention to provide an improved apparatus and method to measure a height of a point on a wire loop accurately, and to avoid some of the disadvantages of the aforementioned prior art. In doing so, a height or profile of a part of the wire loop may be obtained using the invention.

According to a first aspect of the invention, there is provided a method of determining a height of a point on a wire loop, comprising the steps of: positioning a height gauge device over the point on the wire loop; projecting incident light from the height gauge device for illuminating the point; receiving with the height gauge device reflected light produced from the incident light; and determining from a characteristic of the reflected light the height of the said point relative to a reference surface.

According to a second aspect of the invention, there is provided An apparatus for determining a height of a point on a wire loop, comprising: a height gauge device positionable over the point on the wire loop for projecting incident light to illuminate the point and for receiving reflected light produced from the incident light; and a processor coupled to the height gauge device for determining from a characteristic of the reflected light the height of the said point relative to a reference surface.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE INVENTION

An example of a method and apparatus in accordance with the invention will now be described with reference to the accompanying drawings, in which:

FIG. 7 is a graphical representation of heights of a wire loop obtained at various points of the wire loop along a selected section of the loop and illustrates how a highest point of the loop may be mathematically estimated;

FIG. 8 shows a plan view of a coupling bracket for coupling a height gauge device employing the principles of the invention to a wire bonding mechanism according to an example of one implementation of the invention;

FIG. 9 shows a side view of the coupling bracket and height gauge device of FIG. 8;

DETAILED DESCRIPTION OF THE PREFERRED EMBODIMENTS

Figure 1:
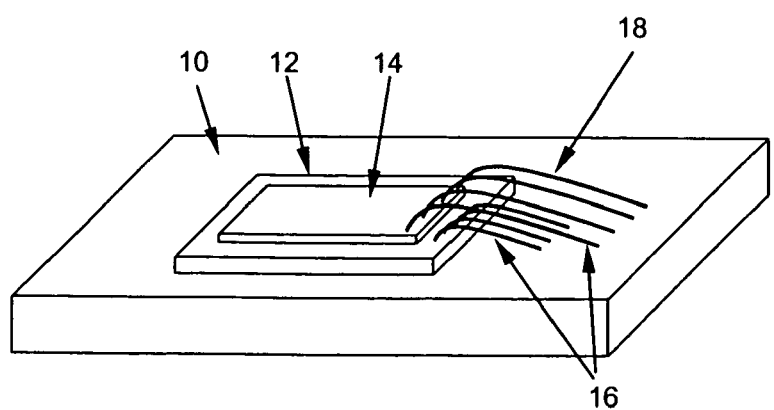
FIG. 1 is an isometric view of a section of a substrate upon which stacked dice are mounted, and dual layers of looped wire bonds made between the dice and the substrate are illustrated.

FIG. 1 is an isometric view of a section of a substrate 10 upon which stacked dice 12, 14 are mounted. Dual layers of looped wire bonds 16 made between the dice 12, 14 and the substrate 10 are illustrated. There are various reference heights associated with the object which may be of interest. There is a base plane at the base of the substrate 10, a substrate height at the top surface of the substrate 10, a height at the top surface of the first die 12, a height at the top surface of the second die 14 and heights at various points of the wire loop 16. The wire loop 16 has a distinctive profile 18 and the highest point of the wire is of particular interest in a wire bonding process because it allows a user to assess whether the loop is properly formed before undergoing further processing. In the preferred embodiments of this invention, the emphasis is on determining the profile 18 of the wire loop 16, and in particular, the position and/or height of its highest point.

Figure 2:
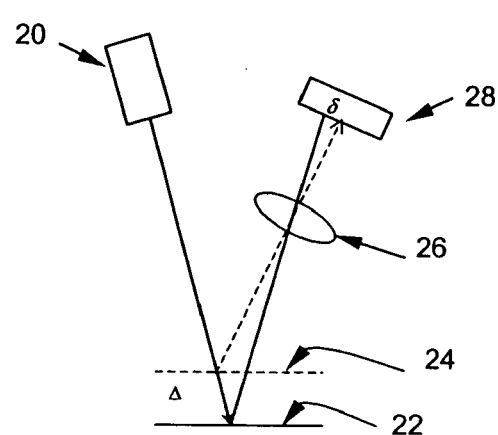
FIG. 2 is a schematic side view representation of a method of determining a height of an object using a triangulation type sensor.

FIG. 2 is a schematic side view representation of a method of determining a height of an object using a triangulation type sensor. An illumination source 20, such as a laser diode with optics, emits a narrow ray of incident light to form a light spot on a reference object surface 22. A reflection or diffusion of the light spot is focused by an imaging system 26 and its position is received and recorded by a receptor, which may be in the form of a position sensitive device (PSD) 28 or sensor. It should be appreciated that the term "reflection" as used in this description includes scattering or other irregular reflection of light. A processor associated with the receptor assesses a characteristic of the received light, which in this example, is a shift of a position where the reflected light is received since the light spot position on the detector varies with the measured height. If a measured surface 24 is at a height of $\Delta$ above the reference object surface 22, the reflection of the light spot (represented by dotted lines in FIG. 2) is shifted and the image of the light spot on the PSD 28 also changes by $\delta$. As the relationship between $\Delta$ and $\delta$ is known in advance from system parameters, structures and/or calibration, the height value $\Delta$ can be determined.

Figure 3:
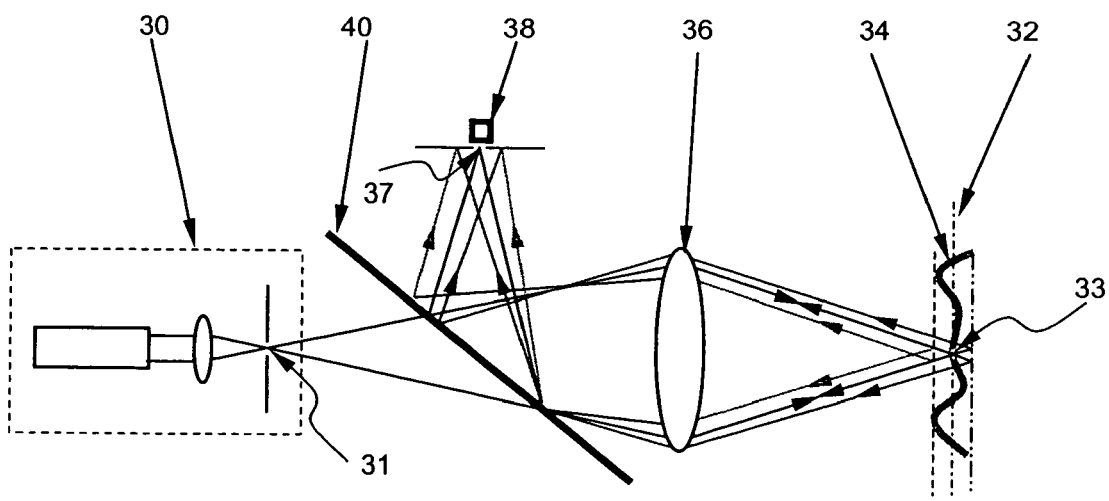
FIG. 3 is a schematic side view representation of another method of determining a height of an object using a confocal type sensor.

FIG. 3 is a schematic side view representation of another method of determining a height of an object using a confocal type sensor. An illumination source such as a point light source 30 restricted by a source pinhole 31 is used, and rays of light it emits are focused by a focusing lens 36 onto a spot of light at a reference surface or depth 32. The spot of light is reflected or scattered from the object at the reference surface or depth 32, and the reflected light is further deflected towards a receptor, such as a point detector 38 or sensor, by a beam splitter 40. A pinhole 37 is placed in front of the point detector 38. The pinholes 31, 37 and image point of the pinhole 31 are preferably conjugated to each other. Most energy is arranged to pass through the pinhole 37 at the reference depth 32 and a maximum light intensity is received on the point detector 38 when light is reflected from the reference depth 32.

If there is defocus due to object depth variation caused by the presence of a measured object 34—whether negative defocus or positive defocus—the reflected and deflected spot of light becomes bigger than the pinhole 37. Only part of the reflected light can pass through the pinhole 37. A processor associated with the receptor assesses the intensity of the received light. Since the relationship between the object depth and light intensity received by the point detector 38 are known or determinable by system parameters and calibration, the height of the measured object 34 can be obtained.

In a common method, a motion structure such as a vibrating device is attached onto the confocal optics so as to modulate the light intensity received on the point detector 38. Under this structure the reflectivity of the object does not affect the measurement result. In another method, the object reflectivity and height gauge device are calibrated in advance so that the object height can be obtained as the intensity of the received light is continuously measured.

FIGS. 2 and 3 are examples of how a height of a point on an object can be measured in the preferred embodiments of the invention, and are not intended to be limiting. It would be appreciated that other methods of height or depth measurement are also possible. It should also be understood that light includes both visible and invisible light energy.

Figure 4A:
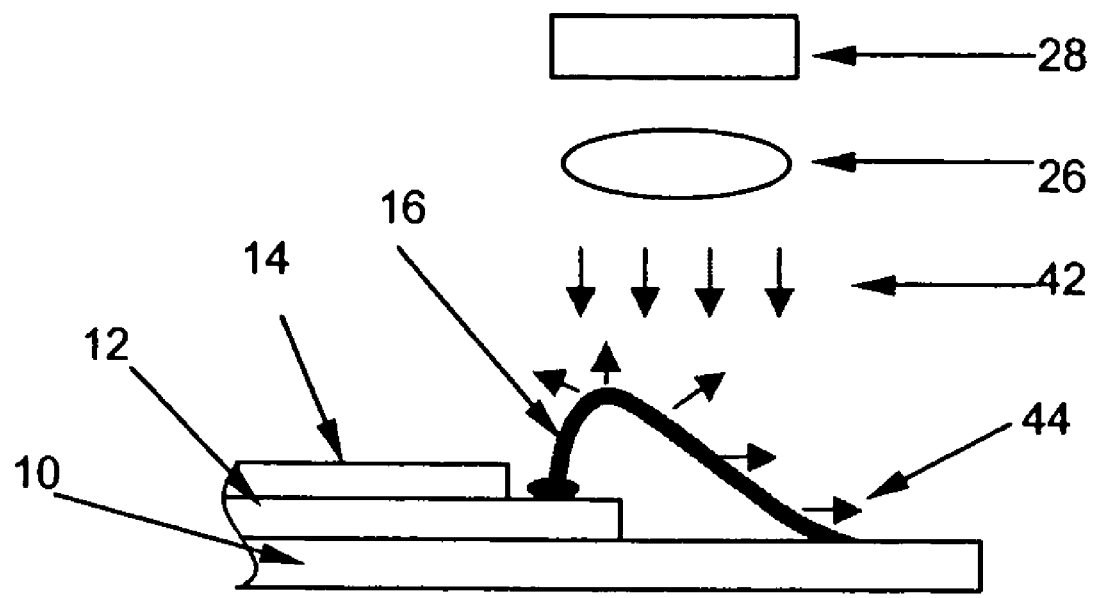
FIG. 4a is a side view illustration of light projected from an illumination lighting system being reflected by a wire loop formed between a die and a substrate according to a first embodiment of the invention.

FIG. 4a is a side view illustration of light 42 projected from an illumination lighting system (not shown) being reflected by a wire loop 16 formed between a die 12 and a substrate 10 according to a first embodiment of the invention. The wire loop 16 has been formed with a wire bonding device by way of a wire bonding process. Using this first embodiment, a location of a highest point on the wire loop 16 is approximated based upon characteristics of the light reflected, and thereafter a height of a point proximate the highest point on the wire loop 16 in that location is determined using a height gauge device.

Illuminating light 42 is projected from the illumination lighting system to illuminate a predetermined portion of the wire loop 16. The lighting device could be an assistant coaxial lighting or high angle side lighting to illuminate the bonded wires. This predetermined portion represents a portion where a highest point of the wire loop 16 is likely to be located, according to a bonding characteristic of a wire bonder machine. Alternatively, substantially the whole of the wire loop 16 may be illuminated. Since bonding wire 16 is principally made from a metallic material, such as gold, aluminum or copper, the wire 16 is generally reflective. The illuminating light 42 will thus be reflected from the surface of the wire 16 in various directions, depending on the profile of the wire loop 16.

The angle of reflection of reflected light 44 will generally be equal to the angle of incidence of the illuminating light 42 projected onto the wire loop 16. Where the illuminating light 42 strikes substantially normally onto the surface of the wire loop 16, the reflected light 44 will be directed towards an imaging system 26 and a light receptor 28 such as a camera. Using the light receptor 28, a location of a highest position of a wire loop can be approximated based upon characteristics of the light reflected. In accordance with a common looping profile of a typical wire loop 16, one or more points on substantially horizontal areas of the loop (i.e. perpendicular to the angle of incidence of illuminating light from the lighting device) are illuminated as in FIG. 4a, resulting in the brightest spots detected by the light receptor 28 in this area of the wire loop 16. Therefore, in this embodiment, the characteristic of light reflected that is of interest is the brightest spots on the wire loop 16.

Figure 4B:
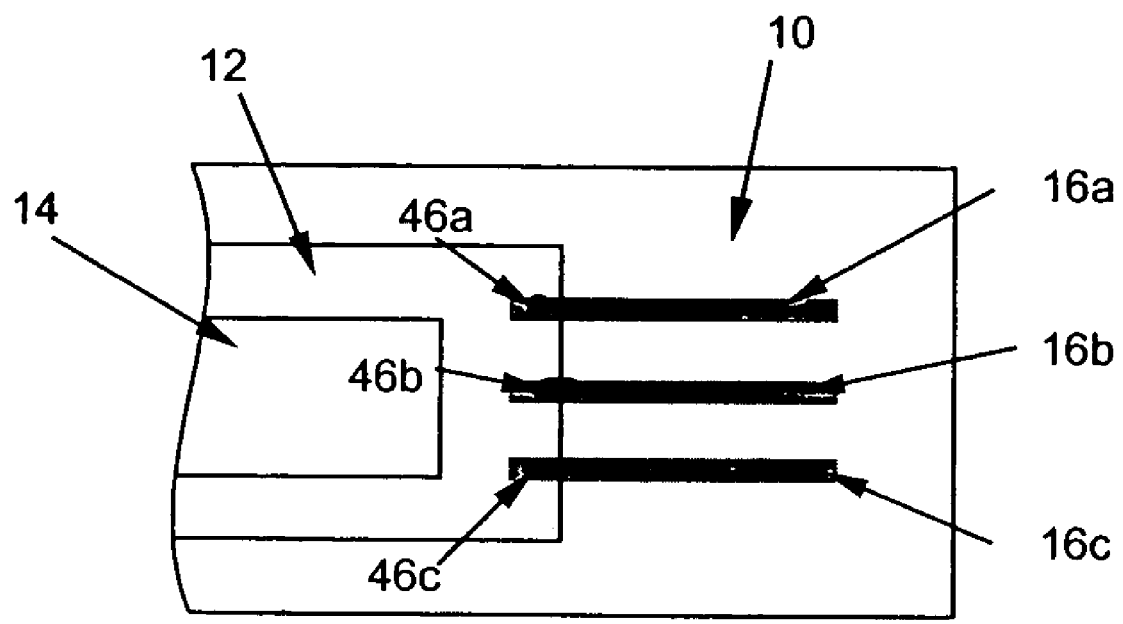
FIG. 4b is a plan view of wire loops formed between the die and the substrate, and bright spots on the wire loops indicating locations of the highest points of the wire loops.

FIG. 4b is a plan view of wire loops 16a–c formed between the die 12 and the substrate 10, and areas of bright spots 46a–c on the wire loops 16a–c indicating locations of the highest points of the wire loops 16a–c. These are the locations where the respective wire loops 16a–c have substantially horizontal profiles, and whereat the positions of highest points of the wire loops 16a–c can be approximated.

A height of a point proximate the highest point of each of the wire loops 16a–c can be determined by positioning a height gauge device over the locations of the bright spots 46a–c to detect the heights of the points on the wire loops 16a–c at those locations. Incident light is projected from the height gauge device for illuminating the point to be measured and reflected light is received by the height gauge device. From a characteristic of the reflected light, such as its deviation from a reference position or brightness of the reflected light received, the height of the point relative to a reference surface can be calculated. For greater accuracy, the height gauge device may be moved across a width of the location to determine the heights of a plurality of points within the said location in order to find the height of a highest point of the wire.

Figure 5:
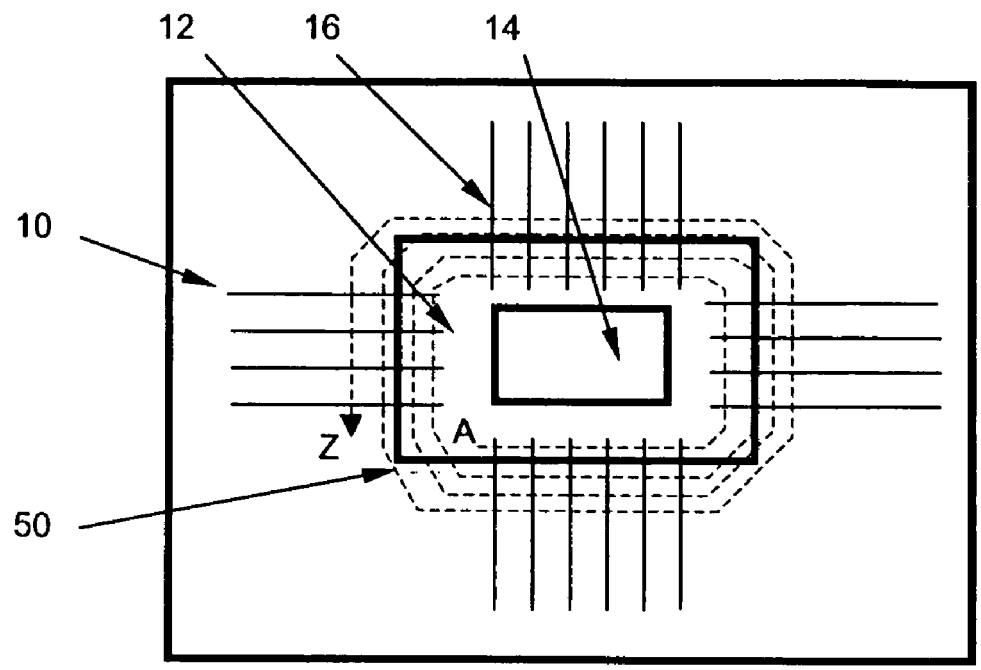
FIG. 5 is a plan view of a scanning routine to determine profiles of selected portions of a plurality of wire loops according to another preferred embodiment of the invention.

FIG. 5 is a plan view of a scanning routine to determine profiles of selected portions of a plurality of wire loops 16 according to another preferred embodiment of the invention. Using this second embodiment, heights of a plurality of points on a wire loop 16 are determined by moving the wire loop 16 relative to the height gauge device. Based upon the heights of the plurality of points, the height of the highest point on a wire loop 16 can be estimated. Alternatively, if the position of the highest point is estimated from the plurality of heights obtained, a height gauge device can be moved to that position to directly measure the height of that point accurately.

Stacked dice 12, 14 are mounted onto a substrate 10. Wire loops 16 are formed between the lower die 12 and the substrate 10. A suitable height gauge device, such as one utilizing the measurement principles as described in FIG. 2 or FIG. 3, is set at a position A over the dice 12, 14 and substrate 10.

Relative movement is then initiated between the substrate 10 and dice 12, 14 on the one hand, and height gauge device on the other, along a scanning path 50 indicated by dotted lines in FIG. 5. Most preferably, the height gauge device is moved. The scanning path 50 is arranged such that incident light projected from the height gauge device intersects a length of each wire loop 16 at a plurality of points. One way of generating relative motion is to couple the height gauge device to a positioning device, which may be in the form of an XY table (not shown). If so, the substrate 10 may remain at a substantially stationary position with the XY table moving the height gauge device relative to it. The scanning routine starts at point A and stops at point Z in a spiral fashion. Alternatively, the scanning path may comprise a series of closed paths rather than in a spiral fashion according to different applications. Heights of points along the scanning path 50 are obtained at a preset resolution for determining a height along each point of the path 50, and in particular, to points of intersection of the path 50 and the wire loops 16.

Figure 6:
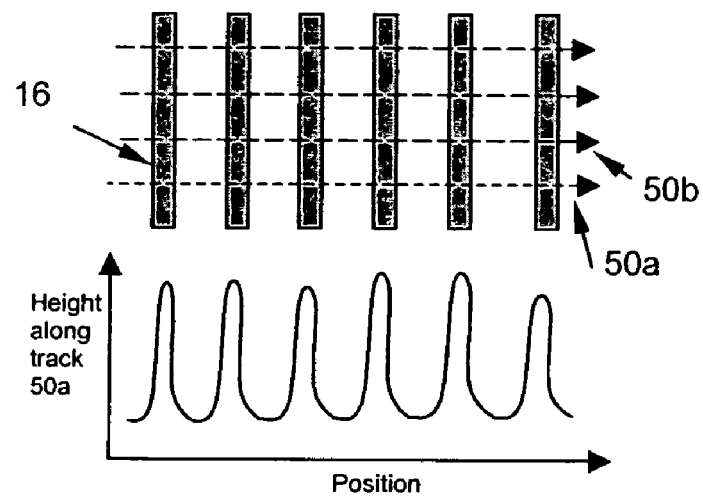
FIG. 6 is a plan view of a series of adjacent wire loops together with a graphical representation of heights corresponding to points on wire loops that intersect an exemplary scanning path using the preferred embodiment of FIG. 5.

FIG. 6 is a plan view of a series of adjacent wire loops 16 together with a graphical representation of heights corresponding to points on wire loops 16 that intersect an exemplary scanning path 50a using the preferred embodiment of FIG. 5. The graph shows a series of peaks corresponding to the locations of wire loops along scanning path 50a. The height of the wire loop 16 at each peak is determinable by the height measuring apparatus and may be recorded by a memory device of the system. The same routine is used for another pass of the scanning path 50b and so on. Combining all the different values that are obtained, the system is able to compute and record the heights of each wire loop along each pass of the scanning path 50a, 50b, etc and a profile 18 for a portion of each wire loop is obtained.

FIG. 7 is a graphical representation of heights $h_1$–$h_4$ of a wire loop 16 obtained at various points $x_1$–$x_4$ of a portion of the wire loop 16 where the scanning path 50 intersects the wire loop 16 along a selected section of the loop, and illustrates by way of example only, how a highest point of the loop 16 may be mathematically estimated based upon the heights of the wire loop 16 obtained at the various points.

A first method involves extrapolation. Straight lines are drawn between points $h_1x_1$ and $h_2x_2$, and between $h_3x_3$ and $h_4x_4$. The highest point is approximately at the intersection of the two straight lines, as shown in FIG. 7. The value of the height at the intersection may be obtained by linear equations.

A second method involves a formulaic curve fitting method, which will depend on the wire bonder machine's wire loop formation setup and process.

Another preferred feature is a mechanism to enable z-axis motion of the height gauge device, or components thereof, in order to change a height of the height gauge device to enlarge its measurement range. This feature is useful to measure different layers of wire loops. An example of wire loops 16 having different general height levels is shown in FIG. 1. The mechanism may either move components of the optics module of the height gauge device, or the full height gauge device.

FIG. 8 shows a plan view of a coupling bracket 60 for coupling a height gauge device 64 employing the principles of the invention to a wire bonding mechanism (not shown) according to an example of one implementation of the invention. The height gauge device 64 may include, without limitation, a triangulation type sensor as demonstrated in FIG. 2, or a confocal type sensor as demonstrated in FIG. 3. The coupling bracket 60 may preferably be mounted to an XY table that is also used for positioning the bond head of a wire bonding mechanism so that the height gauge device 64 may move in conjunction with a wire-bonding tool attached to the bond head, such as an ultrasonic transducer used for ultrasonic welding of bonding wires. In FIG. 8, one end of the coupling bracket 60 includes a wire bonding optics module 62, which is generally used to monitor a wire bonding process. An opposite end of the coupling bracket 60 includes a CCD camera 67 to capture images that are transmitted from the wire bonding optics module 62. The height gauge device 64 is preferably mounted adjacent to the wire bonding optics module 62.

FIG. 9 shows a side view of the coupling bracket 60 and height gauge device 64 of FIG. 8. By maneuvering the coupling bracket 60, the height gauge device 64 is positioned over a semiconductor device 66 that includes a bonded wire 68, so as to measure the heights of one or more points on the bonded wire 68. An illumination lighting system, in the form of a coaxial ring lighting 65, mounted on the underside of the coupling bracket 60 may be used to produce illuminating light onto the bonded wire 68 in accordance with the first embodiment of the invention as described above. Thereafter, the CCD camera 67 may be used in conjunction with the wire bonding optics module 62 to approximate a location of a highest point of the bonded wire 68 according to the first embodiment.

Figure 10:
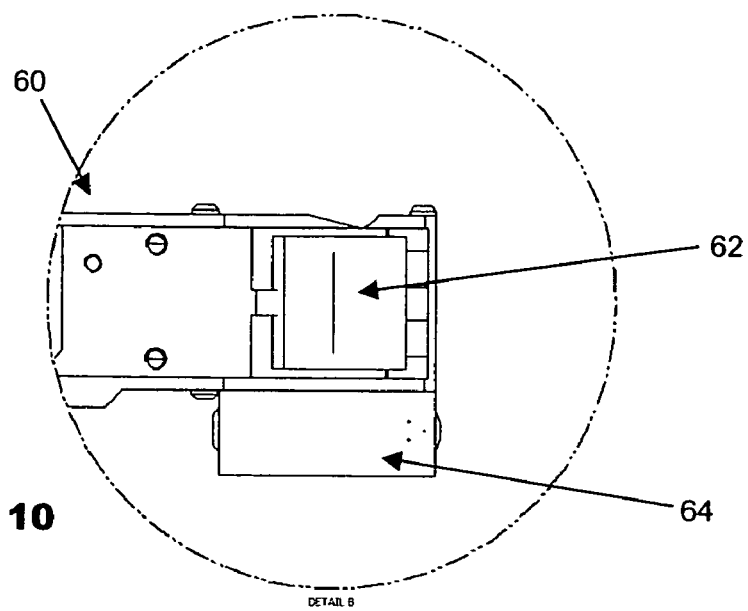
FIG. 10 is an enlarged view of a portion of the coupling bracket marked as "B" in FIG. 8.

FIG. 10 is an enlarged view of a portion of the coupling bracket 60 marked as "B" in FIG. 8. A plan view of the orientations of the wire bonding optics module 62 and height gauge device 64 in relation to the coupling bracket 60 is shown.

Figure 11:
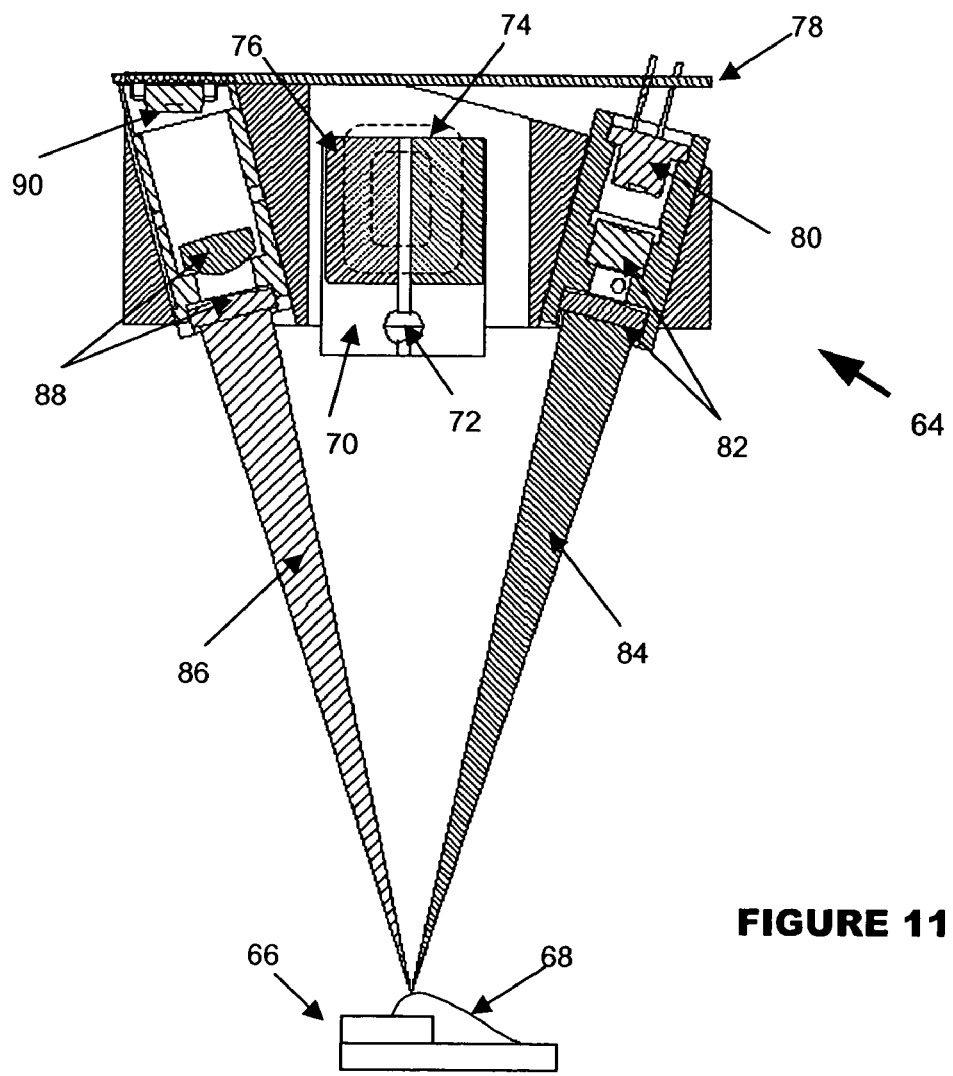
FIG. 11 is a cross-sectional view of the height gauge device taken along sectional line A—A of FIG. 8.

FIG. 11 is a cross-sectional view of the height gauge device 64 taken along sectional line A—A of FIG. 8. The height gauge device 64 is mounted to the coupling bracket 60 by way of a mounting bracket 70. A mounting hole 72 may be included to screw the mounting bracket 70 to the coupling bracket 60.

The height gauge device 64 is adapted for vertical movement in the z-axis relative to the coupling bracket 60. In this particular implementation of the invention, a movement range of 2 mm in both up and down directions is sufficient. Preferably, the height gauge device 64 is coupled to an actuator to generate such vertical movement. The actuator may comprise a linear motor that includes a voice coil 74 positioned between permanent magnets 76 positioned on either side of the voice coil 74 so as to enable vertical movement of the voice coil 74 relative to the permanent magnets 76 by controlling current-flow through the voice coil 74.

A circuit board 78 is arranged at the top of the height gauge device 64 to generate and receive electronic signals from the components of the device 64. It includes a processing device for processing the electronic signals. A light source comprising a laser diode 80 is coupled to the circuit board 78 for projecting incident light. Incident light 84 emitted from the laser diode 80 is passed through optical components, such as collimating and focusing lenses 82 that focus the incident light 84 onto a bonded wire 68 of a semiconductor device 66. The incident light 84 is reflected from a point on the bonded wire 68 to produce reflected light 86 that is passed through imaging lenses 88 of imaging optical components. A position sensitive device 90 coupled to the circuit board 78 is adapted to receive reflected light transmitted through the imaging lenses 88. By sensing the position of the reflected light 86 relative to a reference position, a height of a point on which the incident light 84 hits the bonded wire 68 is determinable. As is apparent from the set-up of the equipment, this implementation utilizes the triangulation method of determining a height of a point on the bonded wire 68 as illustrated in FIG. 2.

The invention described herein is susceptible to variations, modifications and/or additions other than those specifically described and it is to be understood that the invention includes all such variations, modifications and/or additions which fall within the spirit and scope of the above description.

The invention claimed is:

1. A method of determining a height of a highest point on a wire loop, comprising the steps of:
    projecting illumination lighting onto a predetermined portion of the wire loop and determining a location of an approximated highest point on said portion of the wire loop based upon characteristics of light reflected from the said location;
    positioning a height gauge device over the location of the approximated highest point on the wire loop;
    projecting incident light from the height gauge device for illuminating the approximated highest point;
    receiving with the height gauge device reflected light produced from the incident light; and
    determining from a characteristic of the reflected light the height of the said highest point relative to a reference surface.

2. A method according to claim 1, wherein the height gauge device includes a triangulation type sensor.

3. A method according to claim 1, wherein the height gauge device includes a confocal type sensor.

4. A method according to claim 1, wherein an angle of incidence of the illumination lighting at the location of the approximated highest point is substantially normal to a profile of the wire loop at that location.

5. A method according to claim 1, including determining the heights of a plurality of points within the said location.

6. A method according to claim 1, including moving the height gauge device relative to the wire loop for determining the heights of a plurality of points on the wire loop.

7. A method for determining the heights of the highest points on a plurality of wire loops, comprising the steps of:
    positioning a height gauge device over a wire loop;
    projecting incident light from the height gauge device onto the wire loop for illuminating a point on the wire loop;
    receiving with the height gauge device reflected light produced from the incident light;
    determining from a characteristic of the reflected light the height of the said point relative to a reference surface;
    moving the height gauge device relative to the wire loop along a scanning path such that incident light projected from the height gauge device intersects a length of each of a plurality of wire loops;
    wherein the scanning path intersects the length of each wire loop at a plurality of positions.

8. A method according to claim 7, including recording a height of each point on each wire loop at each position where the scanning path intersects each wire loop.

9. A method according to claim 8, including the step of estimating a height of a point proximate a highest position an a wire loop based upon the heights of the wire loop recorded at the various positions where the scanning path intersects the wire loop.

10. An apparatus for determining a height of a highest point on a wire loop, comprising:
    an illumination lighting system adapted to project illuminating light onto a predetermined portion of the wire loop and a light receptor adapted to receive light reflected from the said portion, the light receptor being configured to determine a location of an approximated highest point on said portion of the wire loop based upon characteristics of the light reflected from the said location;
    a height gauge device positionable over the location of the approximated highest point on the wire loop for projecting incident light to illuminate the point and for receiving reflected light produced from the incident light; and
    a processor coupled to the height gauge device for determining from a characteristic of the reflected light the height of the said point relative to a reference surface.

11. An apparatus according to claim 10, wherein the height gauge device includes a triangulation type sensor.

12. An apparatus according to claim 11, including a position sensitive device coupled to the height gauge device for receiving reflected light produced from the incident light.

13. An apparatus according to claim 10, wherein the height gauge device includes a confocal type sensor.

14. An apparatus according to claim 10, wherein the illuminating lighting system is airranged such that an angle of incidence of the illuminating light projected at the location of the approximated highest point is substantially normal to a profile of the wire loop in that location.

15. An apparatus according to claim 10, wherein the height gauge device is positioned adjacent a wire bonding optics module.

16. An apparatus according to claim 10, including a laser diode coupled to the height gauge device for projecting incident light onto the point.

17. An apparatus according to claim 10, including a position sensitive device coupled to the height gauge device for receiving reflected light produced from the incident light.

18. An apparatus determining the heights of the highest points of a plurality of wire loops, comprising:

a height gauge device positionable over a wire loop for projecting incident light to illuminate a point on a wire loop and for receiving reflected light produced from the incident light;

a processor coupled to the height gauge device for determining from a characteristic of the reflected light the height of the said point relative to a reference surface;

a positioning device configured to move the height gauge device relative to the wire loops along a scanning path such that incident light projected front the height gauge intersects a length of each wire loop at a plurality of positions.

19. An apparatus according to claim 18, including a memory device for recording heights of points on the wire loop at each position where the scanning path intersects each wire loop.

20. An apparatus according to claim 19, including a processing device operative to estimate a height of a point proximate a highest position on a wire loop based upon the heights of the wire loop recorded at the various positions where the scanning path intersects the wire loop.

* * * * *